(12) United States Patent
Van Duuren et al.

(10) Patent No.: US 7,429,513 B2
(45) Date of Patent: Sep. 30, 2008

(54) METHOD OF MANUFACTURING A SEMICONDUCTOR DEVICE

(75) Inventors: Michiel Jos Van Duuren, Leuven (BE); Robertus Theodorus Fransiscus Van Schaijk, Leuven (BE); Youri Ponomarev, Leuven (BE); Jacob Christopher Hooker, Leuven (BE)

(73) Assignee: NXP B.V., Eindhoven (NL)

( * ) Notice: Subject to any disclaimer, the term of this patent is extended or adjusted under 35 U.S.C. 154(b) by 493 days.

(21) Appl. No.: 10/546,748

(22) PCT Filed: Feb. 13, 2004

(86) PCT No.: PCT/IB2004/050113

§ 371 (c)(1),
(2), (4) Date: Aug. 23, 2005

(87) PCT Pub. No.: WO2004/077498

PCT Pub. Date: Sep. 10, 2004

(65) Prior Publication Data

US 2006/0166420 A1 Jul. 27, 2006

(30) Foreign Application Priority Data

Feb. 26, 2003 (EP) .................................. 03100469

(51) Int. Cl.
*H01L 21/336* (2006.01)
(52) U.S. Cl. .................................. 438/258; 257/E21.69
(58) Field of Classification Search ................. 438/211, 438/258, 594; 257/E21.69
See application file for complete search history.

(56) References Cited

U.S. PATENT DOCUMENTS

| 5,278,439 A | * | 1/1994 | Ma et al. .................... 257/319 |
| 6,251,729 B1 | | 6/2001 | Montree et al. |
| 6,432,773 B1 | | 8/2002 | Ma et al. |

FOREIGN PATENT DOCUMENTS

WO   WO 01 67 517   3/2000

* cited by examiner

*Primary Examiner*—Chandra Chaudhari
(74) *Attorney, Agent, or Firm*—Peter Zawilski

(57) ABSTRACT

In the method for manufacturing a semiconductor device (100), which comprises a semiconducting body (1) having a surface (2) with a source region (3) and a drain region (4) defining a channel direction (102) and a channel region (101), a first stack (6) of layers on top of the channel region (101), the first stack (6) comprising, in this order, a tunnel dielectric layer (11), a charge storage layer (10) for storing an electric charge and a control gate layer (9), and a second stack (7) of layers on top of the channel region (101) directly adjacent to the first stack (6) in the channel direction (102), the second stack (7) comprising an access gate layer (14) electrically insulated from the semiconducting body (1) and from the first stack (6), initially a first sacrificial layer (90) is used, which is later replaced by the control gate layer (9). A second sacrificial layer (20) is used to protect the part (82) off the surface (2) adjacent to the second sidewall (81) and opposite to the position (83) of the second stack (7) when providing the access gate layer (14).

19 Claims, 6 Drawing Sheets

METHOD OF MANUFACTURING A SEMICONDUCTOR DEVICE

Figure 1:
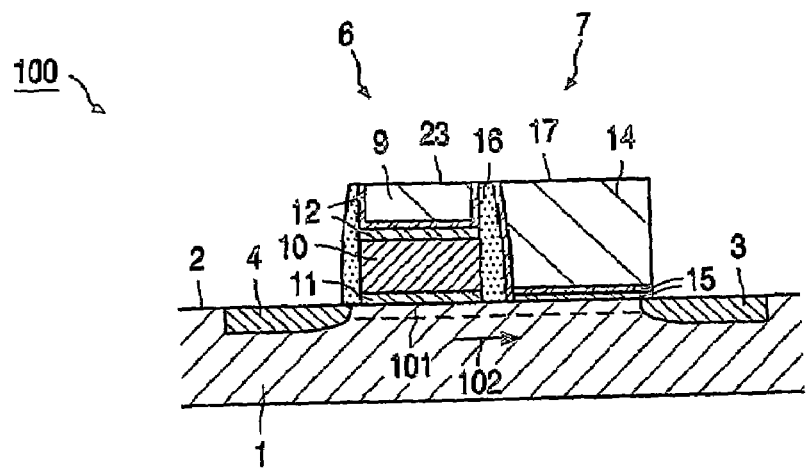

The invention relates to a method for manufacturing a semiconductor device which comprises a semiconducting body having a surface with a source region and a drain region defining a channel direction and a single channel region between the source region and the drain region, a first stack of layers on top of the channel region, the first stack comprising, in this order, a tunnel dielectric layer, a charge storage layer for storing an electric charge, and a control gate layer, and a second stack of layers on top of the channel region directly adjacent to the first stack in the channel direction, the second stack comprising an access gate layer.

WO-A 01/67,517 discloses a non-volatile memory device in which data are stored by means of electric charges. These electric charges are stored in the charge storage layer, which may be a floating gate layer comprising, e.g., a polycrystalline silicon layer, or a charge trapping layer comprising, e.g., a silicon nitride layer. The charge storage layer is arranged on top of the channel region from which it is separated by the tunnel dielectric layer. On top of the charge storage layer is the control gate layer. These two layers are mutually separated and electrically insulated by a dielectric layer, which is referred to as inter-gate dielectric layer when the charge storage layer comprises a floating gate layer. The control gate layer may be, e.g., a further polycrystalline silicon layer. By biasing the control gate layer, electric charges are induced to tunnel from the semiconducting body into the charge storage layer and vice versa, thereby, respectively, writing and erasing the non-volatile memory device.

The semiconductor device further comprises a second stack on top of the channel region adjacent to the first stack in the channel direction. The second stack comprises the access gate layer which may be, e.g., another polycrystalline silicon layer. It is electrically insulated from the semiconducting body by an access gate dielectric layer and from the first stack by an insulating sidewall spacer. In operation the data are read by means of a field effect transistor comprising the source region, the drain region and the channel region. To this end the access gate layer, and in many cases also the control gate layer, are biased. Depending on the amount of charges stored in the charge storage layer the channel region connecting the source region and the drain region is made conductive thereby. The electrical characteristics of the field effect transistor such as, e.g., the threshold voltage, depend on the amount of electric charges stored.

In the known method, initially the first stack is formed, on top of which is a nitride capping layer. Subsequently, the sidewalls of the first stack in the channel direction are provided with insulating sidewall spacers and, subsequently, the surface of the semiconducting body is provided with the access gate dielectric layer. In the next step, this structure is covered by a polycrystalline silicon layer which is polished to expose the nitride capping layer on top of the first stack. Subsequently, a resist layer is supplied and patterned lithographically. In the following etching step the patterned resist layer and the nitride capping layer serve as a mask to define the access gate layer. Because of the nitride capping layer on top of the first stack, the alignment in the lithography step is relatively uncritical.

It is a disadvantage of the known method that only a limited number of materials can be reliably used for the control gate layer and the access gate layer. It is in particular difficult, and often impossible, to use a control gate layer comprising a metal or a metal alloy because etching recipes for a stack comprising the tunnel dielectric layer, the charge storage layer and such a control gate layer either do not exist or are not reliable. Moreover, the pre-fabricated semiconductor device cannot be subjected to relatively high temperatures once the control gate layer comprising a metal or a metal alloy is formed. Therefore, high temperature process steps such as thermal oxidation cannot be performed reliably, if at all, after the control gate layer comprising a metal or a metal alloy has been deposited.

It is an object of the invention to provide a method for manufacturing a semiconductor device as described in the opening paragraph, in which a relatively large number of materials can be used for the control gate layer and the access gate layer.

According to the invention the object is realized in that the method comprises the steps of:

providing the channel region (101) with a provisional first stack (6') comprising, in this order, the tunnel dielectric layer (11), the charge storage layer (10) and a first sacrificial layer (90), providing a second sacrificial layer (20) covering at least a part (82) of the surface (2) adjacent to the first stack (6) and opposite to a position (83) of the second stack (7), removing the first sacrificial layer (90), and providing the control gate layer (9) and the access gate layer (14).

The invention is based on the insight that the above mentioned disadvantage is avoided by initially forming the provisional first stack, in which instead of the control gate layer the first sacrificial layer is used, and by removing the first sacrificial layer later in the process and subsequently providing the control gate layer to the cavity created when removing the first sacrificial layer. This cavity defines the shape of the control gate layer. The first sacrificial layer may comprise, e.g., a polycrystalline silicon layer and a nitride capping layer, i.e. the same materials as used in the known method. As regards these materials it is known that the provisional first stack can be formed reliably. Alternatively, or in addition, the first sacrificial layer may comprise amorphous silicon, monocrystalline silicon, silicon oxide, silicon nitride and/or $Si_xGe_{1-x}$ where x represents the fraction of silicon which may lie, e.g., in the range between about 0.6 and 1.

After having provided the provisional first stack, the second sacrificial layer is provided. It covers the part of the surface adjacent to the first stack opposite to the position of the second stack. This is essential because in this way it is prevented that a layer of conductive material is deposited there when the control gate layer and/or the access gate layer are being provided. At least the position of the second stack is free from the second sacrificial layer. The access gate layer is provided to this recess in the second sacrificial layer in a later step of the process.

U.S. Pat. No. B1-6,251,729 discloses a method in which sacrificial layers are formed at the position of the control gate layer and at the position of the access gate layer. At a later step the sacrificial layer at the position of the control gate layer and a part of the sacrificial layer at the position of the access gate layer are removed. Prior to removing the remaining part of the sacrificial layer at the position of the access gate layer, the charge storage layer is protected by a mask formed by photolithography. The alignment of the mask is not critical because the access gate layer and the control gate layer are well separated by a source region and a drain region, see FIG. 7 of U.S. Pat. No. B1-6,251,729. Then the remaining part of the sacrificial layer at the position of the access gate layer is removed, the mask is removed and the control gate layer and the access gate layer are provided. In contrast to this, in the semiconducting device obtained by the method according to the invention the access gate layer and the control gate layer are not separated by a source region and a drain region, but are directly adjacent to each other. The above mentioned lithography step is then super critical and, therefore, the method known from U.S. Pat. No. B1-6,251,729 for replacing the sacrificial layers by the access gate layer and the control gate layer cannot be applied. As a result the method known from U.S. Pat. No. B1-6,251,729 is not suited for manufacturing the device cited in Claim 1.

In an embodiment the provisional first stack has a first sidewall in the channel direction facing a position of the second stack and has a second sidewall opposite to the first sidewall, wherein the second sacrificial layer also covers at least a part of the surface at the position of the second stack, and the method comprises, prior to the step of providing the control gate layer and the access gate layer, the further steps of:

providing the first sidewall with a sidewall spacer, and removing the second sacrificial layer at least at the position of the second stack thereby creating a first recess, the first recess being separated by the sidewall spacer from the second recess created in the step of removing the first sacrificial layer, the part of the surface adjacent to the second sidewall remaining covered by the second sacrificial layer.

In this embodiment, the first sidewall, i.e. the sidewall of the first stack which will face the second stack at the end of the manufacturing process, is provided with the sidewall spacer. This sidewall spacer defines the shape of the control gate layer and the access gate layer when replacing the first sacrificial layer by the control gate layer and providing the access gate layer, as will be explained in detail below. The sidewall spacer may be an insulating sidewall spacer as is used in the known method. Alternatively, or in addition, it may comprise conductive material as well, provided that the first stack and the second stack are mutually insulated at the end of the manufacturing process.

Conveniently, the second sacrificial layer is removed at least at the position of the second stack thereby creating a first recess. In this way it is assured that the position of the second stack is free from the second sacrificial layer. This partial removal may be done, e.g., by providing a resist layer which is patterned lithographyically. When the materials of the first sacrificial layer and the second sacrificial layer are chosen appropriately, e.g. the provisional first stack has a silicon nitride capping layer and the second sacrificial layer comprises polycrystalline and/or amorphous silicon, the mask alignment of the lithography step is relatively uncritical because the capping layer constitutes a hard mask during etching.

Preferably, the first recess defines the position of the second stack, i.e. the lithography mask used is designed such that the second sacrificial layer is removed only at the position of the second stack, the remainder of the surface remaining covered. In this case the conductive layer will be deposited later on only inside the first recess, the second recess and on top of the second sacrificial layer. It is then possible to remove the conductive layer outside the first recess and outside the second recess by, e.g., polishing without an additional lithography step.

In another step, the first sacrificial layer is removed, thereby creating a second recess which has a shape defining the control gate layer to be formed later on. The first recess and the second recess are mutually separated by the sidewall spacer. It is essential that the part of the surface adjacent to the second sidewall remains covered by the second sacrificial layer. In this way it is prevented that the conductive layer is deposited there.

For the further processing of the prefabricated electrical device thus obtained, there are no steps required which in the known method limited the choice of materials used for the control gate layer and/or the access gate layer.

In a variation of this embodiment, the step of providing the control gate layer and the access gate layer comprises providing a conductive layer to the first recess and the second recess, the conductive layer at least partly covering the second sacrificial layer, and removing at least a part of the conductive layer outside the first recess and the second recess thereby exposing the second sacrificial layer and electrically insulating the conductive layer in the first recess from the conductive layer in the second recess.

In this variation of the embodiment, the conductive layer is provided to the first recess and the second recess. It at least partly covers the second sacrificial layer. The conductive layer outside the first recess and the second recess is removed, e.g. by polishing, to at least such an extent that the second sacrificial layer is exposed and that the conductive layer in the first recess is electrically insulated from the conductive layer in the second recess. The access gate layer thus formed comprises the conductive layer in the first recess whereas the control gate layer comprises the conductive layer in the second recess. The electrical insulation of the control gate layer from the access gate layer may be achieved by an insulating sidewall spacer and/or by a dielectric layer as will be explained below.

Instead of polycrystalline silicon the first sacrificial layer and/or the second sacrificial layer may comprise other materials. Alternatively, or in addition, they may comprise amorphous silicon, monocrystalline silicon, silicon oxide, silicon nitride and/or $Si_xGe_{1-x}$ where x represents the fraction of silicon which may lie, e.g., in the range between about 0.6 and 1. Preferably, the material of the first sacrificial layer is compatible with the other materials used in the method, the provisional first stack is formed reliably, and the first sacrificial layer is removable without, at the same time, removing the second sacrificial layer, in particular at the part of the surface adjacent to the second sidewall. Preferably, the second sacrificial layer is removable without, at the same time, removing the first sacrificial layer when creating the first recess. In this case the charge storage layer is protected by the first sacrificial layer when the first recess is being created.

Instead of the polycrystalline silicon layer used as a charge storage layer, a charge-trapping layer such as, e.g., silicon nitride or a material comprising silicon nanocrystals may be used. Alternatively, or in addition, the charge storage layer may comprise a dielectric material with a dielectric constant higher than that of silicon dioxide such as, e.g. aluminum oxide and/or hafnium oxide.

In an embodiment, the first stack comprises an inter-gate dielectric layer electrically insulating the charge storage layer from the control gate layer, the second stack comprises an access gate dielectric layer electrically insulating the access gate layer from the semiconducting body, and the method further comprises the step of providing a dielectric layer to the first recess and the second recess after the first recess and the second recess have been created and before the conductive layer has been provided. As a result of this step the inter-gate dielectric layer comprises the dielectric layer provided to the first recess and the access gate dielectric layer comprises the dielectric layer provided to the second recess.

Alternatively, or in addition, the inter-gate dielectric layer or at least a part of it may be formed between the charge storage layer and the first sacrificial layer when forming the provisional first stack. The access gate dielectric layer or at least a part of it may be formed prior to providing the second sacrificial layer.

When the inter-gate dielectric layer and/or the access gate dielectric layer have been at least partly formed before removing the first sacrificial layer and/or the second sacrificial layer, these parts may get damaged when removing the first sacrificial layer and/or the second sacrificial layer. By the extra step of providing the dielectric layer, such damage is at least reduced and preferably fully removed prior to providing the conductive layer.

This extra step of providing the dielectric layer is particularly advantageous if the dielectric layer has a dielectric constant higher than that of silicon oxide, i.e. if the dielectric layer comprises a so-called high-k material. These materials have the advantage that due to the relatively high dielectric constant the electric coupling between the control gate layer and the charge storage layer, and between the access gate layer and the semiconducting body, is relatively large. Because of this relatively large coupling, relatively low voltages and relatively thick dielectric layers may be used.

Most of the high-k materials known have the disadvantage that they cannot withstand relatively high temperatures associated with, e.g., standard CMOS processing. Therefore, they have to be supplied in a process flow in which these relatively high temperatures are avoided once such a material has been provided. The method according to the invention comprising this extra step is particularly suited for these high-k materials because the sidewall spacer which usually requires such relatively high temperatures is formed prior to the deposition of the dielectric layer. In the method according to the invention the steps required after deposition of the dielectric layer are compatible with the high-k material.

In another embodiment the conductive layer comprises a metal or a metal alloy. Such a conductive layer is often advantageous because it has a resistivity lower than polycrystalline silicon used in the known method. Most of the metals and the metal alloys have the disadvantage that they cannot be etched reliably, in particular when they are part of a stack such as the first stack which comprises several layers of different materials. The method according to the invention is particularly suited when the control gate layer and the access gate layer comprise a metal or a metal alloy because etching of the control gate layer is not necessary at all and etching of the access gate layer is relatively uncritical. Moreover, relatively high temperatures are avoided after having deposited the control gate layer and the access gate layer. When the first recess defines the position of the second stack, i.e. the lithography mask used is designed such that the second sacrificial layer is removed only at the position of the second stack, it is not necessary at all to etch the access gate layer.

It is advantageous if the first sacrificial layer comprises a silicon layer such as, e.g., a polycrystalline silicon layer, which is separated from the charge storage layer by a separation layer. The silicon layer can be etched using the recipe of the known method and the separation layer protects the charge-trapping layer when the first sacrificial layer is being removed. The separation layer may comprise, e.g., silicon oxide and/or silicon nitride because the silicon layer can be selectively etched with respect to these materials. The separation layer may form part of the inter-gate dielectric layer.

In this embodiment it is further advantageous if the first sacrificial layer comprises a capping layer on a surface of the silicon layer opposite to the surface of the semiconducting body. This capping layer, which may be, e.g., silicon nitride, may act as a hard mask when removing parts of the second sacrificial layer to form the first cavity. This has the advantage that the first cavity is formed without removing parts of the first sacrificial layer, thus protecting the charge storage layer, and the inter-gate dielectric layer, if present.

Figure 2A:
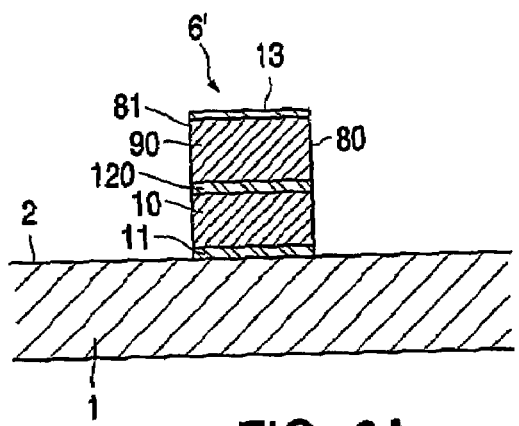
Figure 2B:
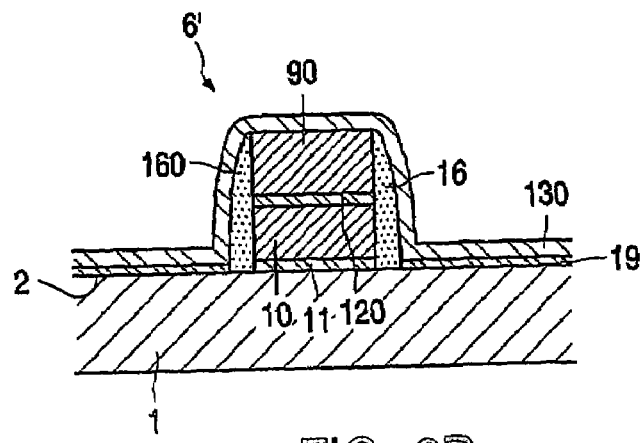
Figure 2C:
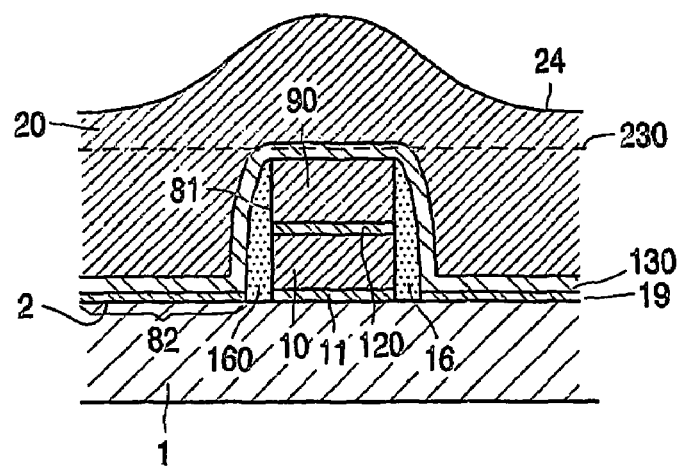
Figure 2D:
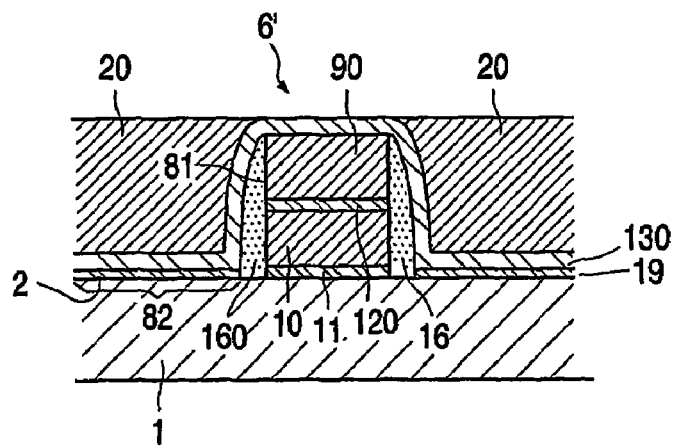
Figure 2E:
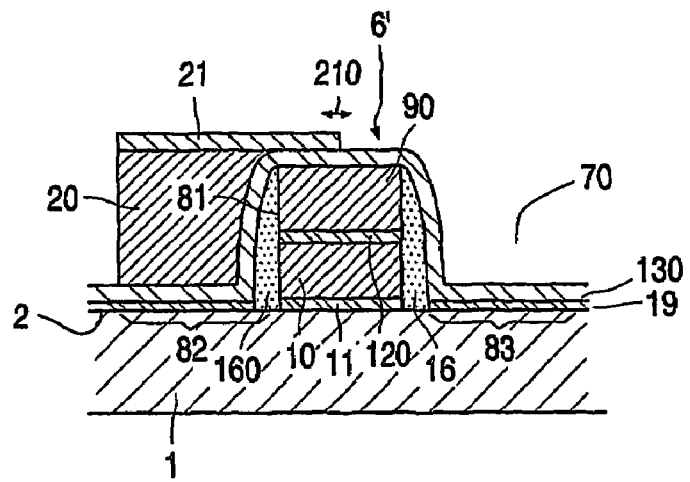
Figure 2F:
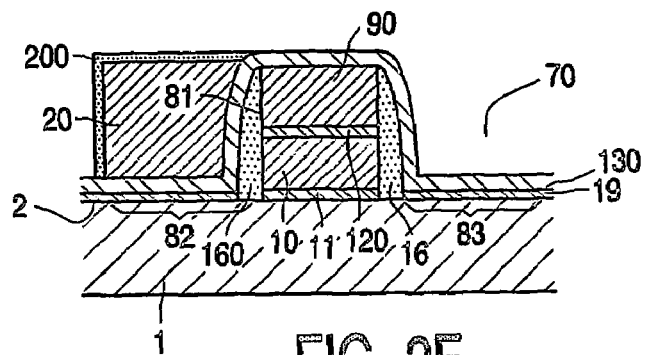
Figure 2G:
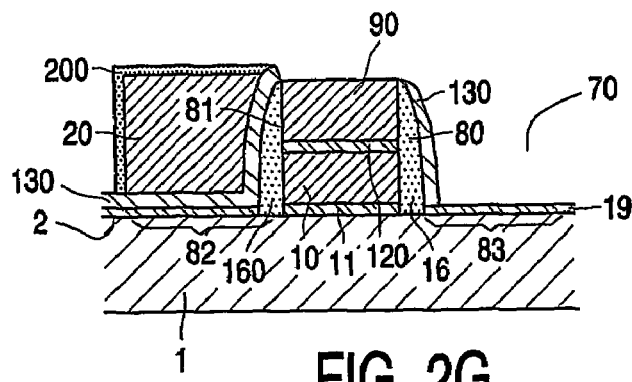
Figure 2H:
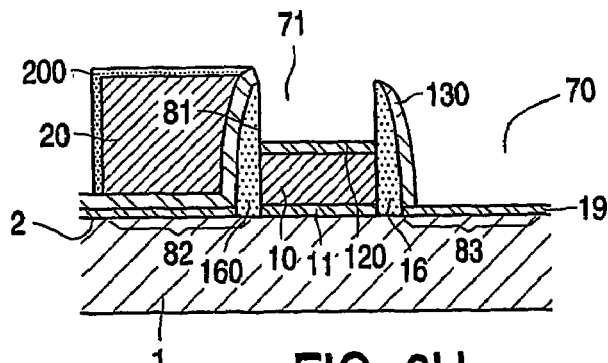
Figure 2I:
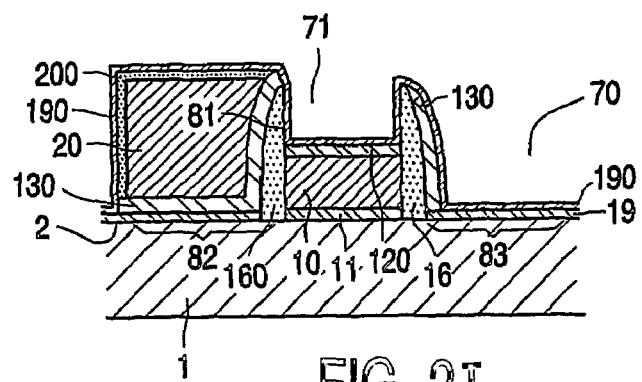
Figure 2J:
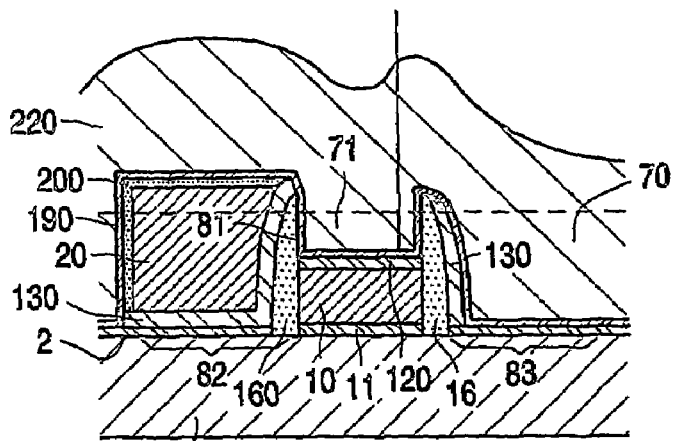
Figure 2K:
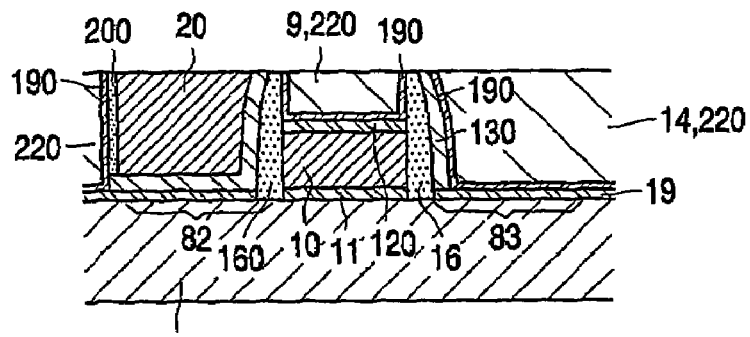
Figure 2L:
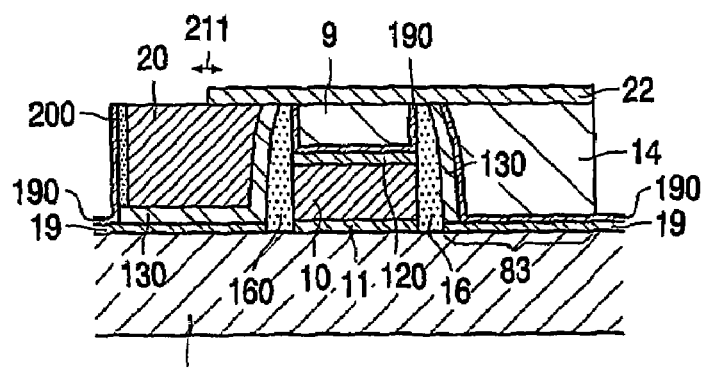
Figure 2M:
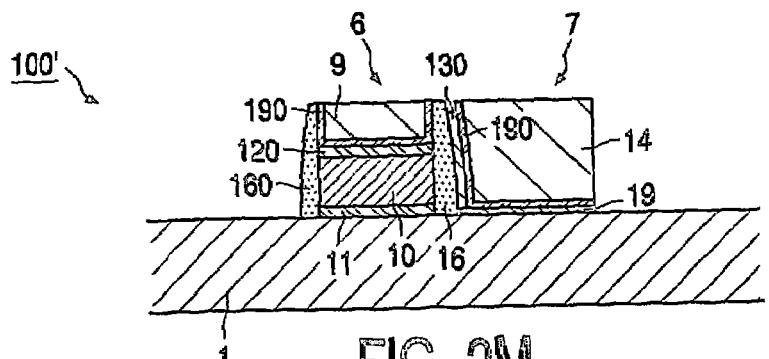
Figure 3A:
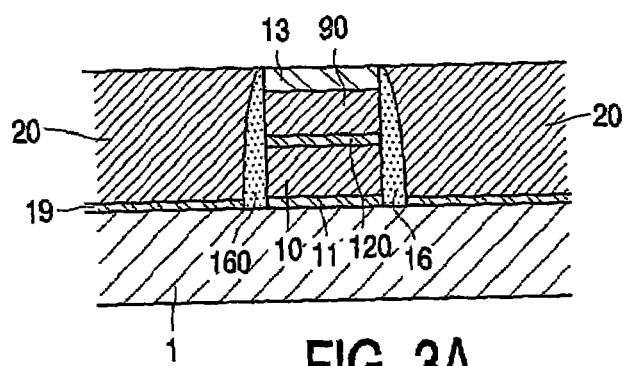
Figure 3B:
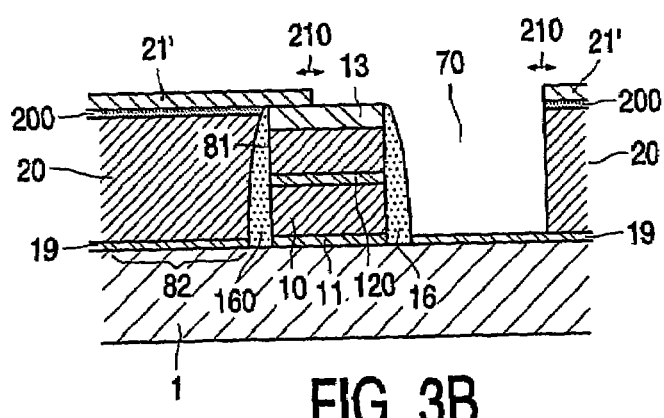
Figure 3C:
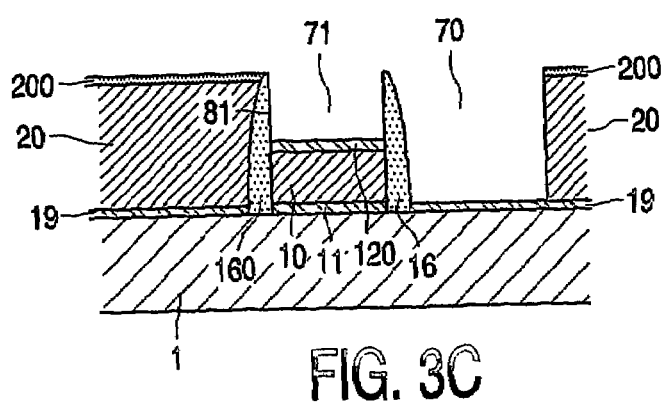
Figure 3D:
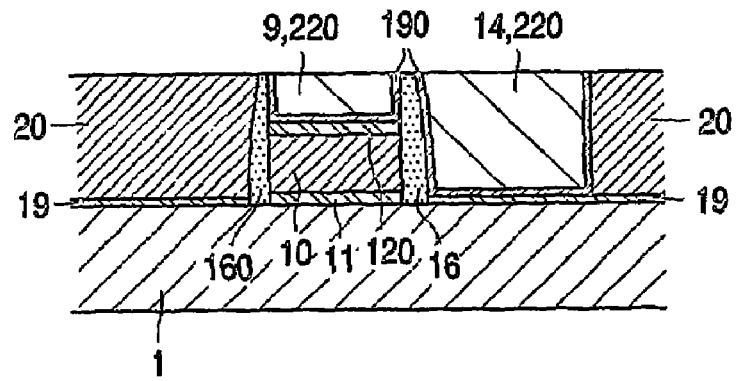
Figure 3E:
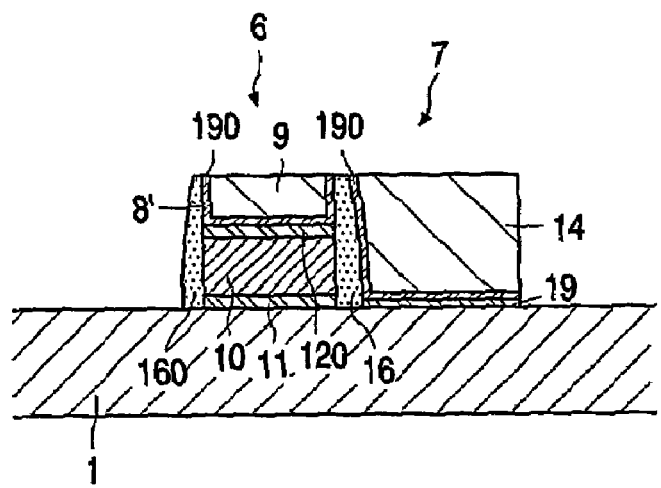
Figure 4:
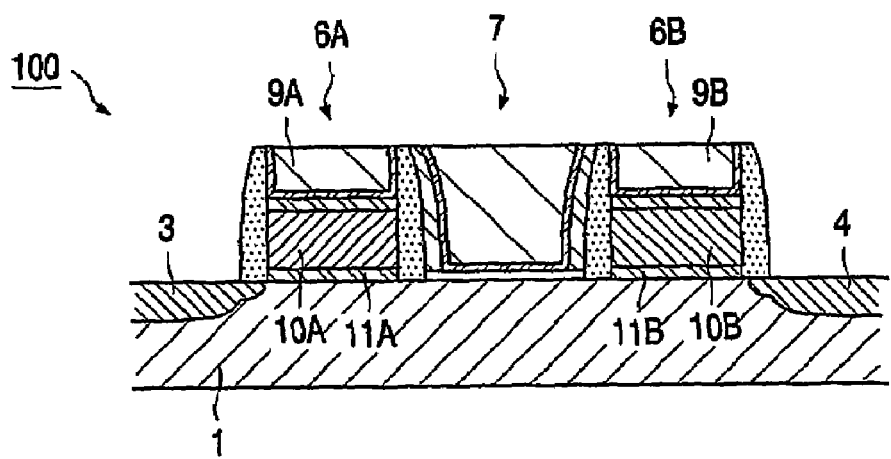

These and other aspects of the method for manufacturing a semiconductor device according to the invention will be further elucidated and described with reference to the drawings, in which:

FIG. 1 is a cross section through an embodiment of the semiconductor device obtained by the method, FIGS. 2A-2M are cross sections through the semiconductor device at various steps of an embodiment of the method, and FIGS. 3A-3E are cross sections through the semiconductor device at various steps of another embodiment of the method, and FIG. 4 is a cross section through another embodiment of the semiconductor device obtained by the method.

The Figures are not drawn to scale. In the Figures, like reference numerals generally refer to like parts.

A semiconductor device 100, manufactured with the method according to the invention and shown in FIG. 1, comprises a semiconducting body 1 of a first conductivity type, in the present example a silicon body of, for example, p-type conductivity. The semiconducting body 1 has a surface 2 with a source region 3 and a drain region 4 of an opposite, second conductivity type, in the present example n-type conductivity. The source region 3 and the drain region 4 may each comprise an extension, not shown, having a different, e.g. lower, doping concentration. The source region 3 and the drain region 4 define a channel region 101 and a channel direction 102.

The surface 2 is provided with a first stack 6 of layers arranged on top of the channel region 101. The first stack 6 comprises, in this order, a tunnel dielectric layer 11, a charge storage layer 10 for storing an electric charge, an inter-gate dielectric layer 12 and a control gate layer 9. The first stack 6 constitutes the gate of a memory transistor. The inter-gate dielectric layer 12 electrically insulates the charge storage layer 10 from the control gate layer 9.

The surface 2 is further provided with a second stack 7 of layers on top of the channel region 101 directly adjacent to the first stack 6 in the channel direction 102. The second stack 7 comprises an access gate dielectric layer 15 and an access gate layer 14. It constitutes the gate of an access transistor which enables, e.g., random access of a particular semiconducting device 100 in an array of such semiconducting devices 100. The access gate layer 14 is electrically insulated from the semiconducting body 1 by the access gate dielectric layer 15 and from the first stack 6 by a sidewall spacer 16 which may comprise, e.g., silicon oxide or silicon nitride.

In one embodiment the charge storage layer 10 is a layer of a conductive material which is surrounded on all sides by electrically insulating material and forms a floating gate. The floating gate acts as a charge storage layer 10 in which data in the form of electric charge may be stored. The charge storage layer 10 may be composed of, e.g., polycrystalline silicon which may be doped with, e.g., phosphorus. Alternatively, amorphous silicon or $Si_xGe_{1-x}$ may be used. Here, x represents the fraction of silicon which may lie, e.g., in the range between about 0.6 and 1.

In another embodiment the charge storage layer 10 is a charge trapping layer which is a dielectric such as, e.g., silicon nitride or an insulating material comprising silicon nanocrystals. It comprises a distribution of mutually separated trapping centers wherein electric charge can be stored. In such a charge trapping layer, electric charge cannot only be provided throughout the length of the charge storage layer 10 but also selectively at the side of the channel region 101 adjacent to the source region 3 or adjacent to the drain region 4. Since these different conditions can be distinguished in the reading process, two bits are storable in one semiconducting device 100.

The charge storage layer 10 is insulated from the semiconductor body 1 by a tunnel dielectric layer 11 which may be composed of, e.g., silicon oxide. Alternatively, the tunnel dielectric layer 11 and/or the inter-gate dielectric layer 12 may be composed of a dielectric material whose dielectric constant is significantly higher than that of silicon oxide, such as tantalum oxide, aluminium oxide or silicon nitride. Other suitable materials for the inter-gate dielectric layer 12 are, e.g., silicon oxynitride (SiON) and a sandwich of silicon oxide, silicon nitride and silicon oxide (ONO).

The control gate layer 9 and the access gate layer 14 may be composed of, e.g., polycrystalline silicon which may be doped with, e.g., phosphorus. Alternatively they may comprise amorphous silicon or $Si_xGe_{1-x}$ where x represents the fraction of silicon which may lie in the range between about 0.6 and 1. Preferably, the control gate layer 9 and the access gate layer 14 are composed of a metal or a metal alloy such as, e.g., TaN, TaSiN or TiAlN. Instead of a single layer of any of these materials, a stack of two or more, e.g. of these, materials may be used.

The inter-gate dielectric layer 12 and/or the access gate dielectric layer 15 may be composed of, e.g., silicon oxide. Preferably, the inter-gate dielectric layer 12 and the access gate dielectric layer 15 comprise a dielectric material whose dielectric constant is higher than that of silicon oxide, such as, e.g., tantalum oxide, hafnium oxide, zirconium oxide, aluminum oxide or silicon nitride.

The access gate layer 14 has the shape of a block which is disposed against the first stack 6 without overlapping the first stack 6. The access gate 14 has a substantially flat surface portion 17 extending substantially parallel to the surface 2 of the semiconductor body 1. The substantially flat surface portion 17 of the access gate layer 14, the source region 3 and the drain region 4 are provided with a metal silicide, not shown, such as, e.g. a low ohmic phase of titanium silicide. In the case that the access gate layer 14 comprises a metal or a metal alloy, the silicidation of this layer may be omitted. In this embodiment, the substantially flat surface portion 17 of the access gate layer 14 is located at substantially the same height as the top surface portion 23 of the control gate layer 9.

In the embodiment shown in FIG. 1, the access gate layer 14 is provided at the side of the first stack 6 adjacent to the source region 3. Alternatively, the access gate layer 14 may also be provided at the side of the first stack 6 adjacent to the drain region 4. The semiconductor device 100 may be part of a matrix comprising several semiconductor devices 100. The matrix may be embedded in a CMOS or BICMOS integrated circuit, or may be part of a stand-alone non-volatile memory.

FIGS. 2A-2M show diagrammatic cross-sectional views of successive stages in the manufacture of the semiconducting device 100 using an embodiment of the method in accordance with the invention.

The method according to the invention comprises the step of providing the channel region 101 with a provisional first stack 6', shown in FIG. 2A, comprising, in this order, the tunnel oxide layer 11, the charge storage layer 10 and a first sacrificial layer 90, which is a polycrystalline silicon layer. The charge storage layer 10 is separated from the first sacrificial layer 90 by a dielectric layer 120 of, e.g., silicon oxide, providing a part of the inter-gate dielectric layer 12 to be formed later on in the process. The dielectric layer 120 constitutes a separation layer, which is advantageous when removing the first sacrificial layer 90 at a later stage of the process. The provisional first stack 6' has a first sidewall 80 in the channel direction 102 facing a position 83 of the second stack 7 and having a second sidewall 81 opposite to the first sidewall 80. The provisional first stack 6' may further comprise a, e.g. insulating, capping layer 13 shown in FIG. 2A, which is advantageous in a later step to be discussed with reference to FIG. 2D. The capping layer 13 may be, e.g., a silicon nitride layer. The resulting structure shown in FIG. 2A is identical to the structure shown in FIG. 2 of U.S. Pat. No. B1-6,251,729 and may be formed in a way well known in the art, e.g., by depositing the different layers and subsequently patterning these layers so as to form the provisional first stack 6'.

In a next step shown in FIG. 2B, the first sidewall 80 and the second sidewall 81 are covered with sidewall spacers 16 and 160 composed of, e.g., silicon oxide and/or silicon nitride to electrically insulate the access gate layer 14, which is to be provided in a later step of the process, from the first stack 6, and to allow for replacement of the first sacrificial layer 90 by the control gate layer 9 in a later step of the process. Subsequently, the exposed parts of the surface 2 are provided with a dielectric layer 19 providing a part of the access gate dielectric layer 15 in a later stage of the process. The dielectric layer 19 is preferably formed by thermal oxidation of the semiconducting body 1 at the surface 2. Preferably, the thickness of the dielectric layer 19 is optimized such that the dielectric layer 19 in combination with the dielectric layer 190 provided in a later step of the process, forms the access gate dielectric layer 15 having the designed equivalent oxide thickness (EOT). Here and in the remainder of the description, thickness refers to a dimension in a direction substantially perpendicular to the surface 2.

The resulting structure is then provided with a further capping layer 130 in order to prevent further growth of the dielectric layer 19 in a later process step which will be discussed below with reference to FIG. 2F. In an alternative embodiment the further capping layer 130 is omitted. In this case the thickness of the dielectric layer 19 has to be reduced to account for the additional growth of it during the oxidation shown in FIG. 2F.

In the next step a second sacrificial layer 20, which may also comprise polycrystalline silicon, is applied. The second sacrificial layer 20 covers the second sidewall 81 and a part 82 of the surface 2 adjacent to the second sidewall 81. In this embodiment the second sacrificial layer 20 is applied to the entire exposed surface of the pre-fabricated semiconductor device 100 shown in FIG. 2B. Preferably, the second sacrificial layer 20 has a thickness such that the upper surface 24 of it next to the provisional first stack 6' is located at substantially the same height as, or higher than, the top surface portion of the provisional first stack 6'. Here height indicates the distance from the surface 2. The preferred minimum height is indicated by a dashed line 230.

With reference to FIG. 2D, parts of the second sacrificial layer 20 are removed to expose the provisional first stack 6', i.e. the height of the second sacrificial layer 20 is reduced to the preferred minimum height. The removal of these parts of the second sacrificial layer 20 is preferably done by a planishing treatment, preferably by chemical-mechanical polishing (CMP). The provisional first stack 6' advantageously comprises the capping layer 13 or the further capping layer 130 as the uppermost layer, which may be used as a stopping layer in the planishing treatment. When, e.g. polycrystalline or amorphous, silicon is applied as the second sacrificial layer 20, the capping layer 13 is advantageously composed of silicon oxide or silicon nitride.

In a next step, the result of which is shown in FIG. 2E, the second sacrificial layer 20 is patterned using a mask 21. The mask 21 exposes the second sacrificial layer 20 at least at the position 83 of the second stack 7 while the mask 21 covers at least that part of the second sacrificial layer 20 covering the second sidewall 81 and the part 82 of the surface 2 adjacent to the second sidewall 81. In the embodiment of FIG. 2E the entire second sacrificial layer 20, except for this latter part, is removed. In another embodiment shown in FIG. 3B the second sacrificial layer 20 is removed solely at the position 83 of the second stack 7. The second sacrificial layer 20 is advantageously patterned by means of photolithography. For that purpose, a photoresist layer is deposited on top of the structure shown in FIG. 2D. The photoresist layer may be patterned by means of exposure to, e.g., visible or ultra violet (UV) light or to charged particles such as electrons, in order to form the mask 21. Unmasked parts of the second sacrificial layer 20 are removed by, e.g., etching. In this way a first recess 70 is created while the second sidewall 81 and the part 82 of the surface 2 adjacent to the second sidewall 82 remain covered by the second sacrificial layer 20. When the provisional first stack 6' comprises the capping layer 13 or the further capping layer 130, these layers may be used as a hard mask and the alignment of the mask 21 is not very critical in the channel direction as indicated by arrow 210.

Subsequently, the mask 21 is removed and the remaining second sacrificial layer 20 is provided with a protection layer 200 shown in FIG. 2F. The protection layer 200 is preferably composed of silicon oxide if the second sacrificial layer 20 is composed of, e.g. polycrystalline or amorphous, silicon. Preferably, the further capping layer 130 is present and composed of silicon nitride to prevent or at least reduce further oxidation of the semiconducting body 1 at the position 83 of the second stack 7. The protection layer 200 protects the second sacrificial layer 20 during the next step shown in FIG. 2O. In this step the further capping layer 130 and the capping layer 13 are removed to expose the first sacrificial layer 90. In the embodiment shown in FIG. 2G a part of the further capping layer 130 remains next to the sidewall spacer 16. It will be an integral part of the semiconducting device 100 at the end of the process. In another embodiment, not shown, a wet etch is used and this part of the further capping layer 130 is removed as well.

In the next step the first sacrificial layer 90 is removed, thereby creating a second recess 71, shown in FIG. 2H. The second sidewall 81 and the part 82 of the surface 2 adjacent to the second sidewall 81 remain covered by the second sacrificial layer 20 to prevent that the conductive layer 220 to be provided at a later step in the process is provided at this position. The first recess 70 is separated from the second recess 71 by the sidewall spacer 16.

After having created the first recess 70 and the second recess 71, and prior to providing the conductive layer 220, the structure shown in FIG. 2H is provided with a dielectric layer 190 which covers the surfaces of the first recess 70 and the second recess 71, shown in FIG. 2I. The dielectric layer 190 is preferably composed of a material having a dielectric constant higher than that of silicon oxide. The dielectric layer 190 in the first recess 70 and the dielectric layer 19 constitute the access gate dielectric layer 15. The dielectric layer 190 in the second recess 71 and the dielectric layer 120 constitute the inter-gate dielectric layer 12.

In the next step the conductive layer 220 shown in FIG. 2J is provided. It fills the first recess 70 and the second recess 71 and at least partly covers the second sacrificial layer 20. Preferably, the conductive layer 220 comprises a metal or a metal alloy as mentioned above. Subsequently, the conductive layer 220 outside the first recess 70 and the second recess 71 is removed. The removal of the superfluous parts of the conductive layer 220 is preferably done by a planishing treatment, preferably by chemical-mechanical polishing (CMP). In this step the second sacrificial layer 20 is exposed and the conductive layer 220 in the first recess 70 is electrically insulated from the conductive layer 220 in the second recess 71, thereby constituting the access gate layer 14 and the control gate layer 9, respectively, as shown in FIG. 2K.

Subsequently, the remaining conductive layer 220 is patterned using a mask 22. The mask 22 exposes those parts of the conductive layer 220 which are free of the access gate layer 14 and of the control gate layer 9 while it covers these two layers 9 and 14. The conductive layer 220 is advantageously patterned by means of photolithography. For that purpose, a photoresist layer is deposited on top of the structure shown in FIG. 2K which is patterned to form the mask 22, e.g. in a similar way as when forming mask 21. Unmasked arts of the conductive layer 220 are removed by, e.g., etching. In this way the access gate layer 14 is formed and those parts of the conductive layer 220 free of the access gate layer 14 and of the control gate layer 9 are removed. During this removal the second sacrificial layer 20 is used as a hard mask and the alignment of the mask 22 is, therefore, not very critical in the channel direction as indicated by arrow 211 shown in FIG. 2L.

After thus having formed the access gate layer 14, the second sacrificial layer 20 and the dielectric layers 19 and 190 and the capping layer 130 outside the semiconductor device 100 are removed. The result is shown in FIG. 2M.

The surface 2 is then provided with the source region 3 and the drain region 4 of the second, opposite conductivity type, in the present example n-type, by means of, e.g., an implantation of phosphorus or arsenic. In this step the pre-fabricated semiconductor device 100' shown in FIG. 2M may be used as a mask during the implantation. Preferably, the implanted ions are annealed by a rapid thermal anneal (RTA).

Finally, the semiconductor device may be completed by conventional CMOS process flow steps, not shown, for oxide deposition, contact definition and metallization with one or more metal layers.

FIGS. 3A-3E show diagrammatic cross-sectional views of successive stages in the manufacture of the semiconducting device 100 of FIG. 1 using another embodiment of the method in accordance with the invention.

In this embodiment, initially the provisional first stack 6' is provided similar to that shown in FIG. 2A. Then, still analogous to the embodiment of the method described above, the sidewall spacers 16 and 160 are formed and the dielectric layer 19 is provided. Subsequently, unlike the process flow of FIGS. 2A-2M, the second sacrificial layer 20 is provided. The further capping layer 130 of FIG. 2B is omitted, and the structure is planished to expose the capping layer 13 of the provisional first stack 6' shown in FIG. 3A. The surface of the second sacrificial layer thus obtained is provided with the protection layer 200, analogous to the process step shown in FIG. 2F.

In the next step, the second sacrificial layer 20 is patterned using a mask 21'. The mask 21' exposes the second sacrificial layer 20 at the position 83 of the second stack 7. Analogous to the embodiment of the method described above, the second sacrificial layer 20 is advantageously patterned by means of photolithography. In this way a first recess 70 is created which defines the position of the second stack 7, while the second sidewall 81 and the part 82 of the surface 2 adjacent to the second sidewall 82 remain covered by the second sacrificial layer 20. The capping layer 13 is used as a hard mask and the alignment of the mask 21' is not very critical in the channel direction as indicated by arrow 210'.

After having created the first recess 70, the mask 21' and the first sacrificial layer 90 are removed resulting in a structure shown in FIG. 3C, in which the first recess 70 is separated from the second recess 71 by the sidewall spacer 16. Following similar steps as described with reference to FIGS. 2I-2K, the dielectric layer 190 and the conducting layer 220 are provided, and the conducting layer 220 outside the first recess 70 and outside the second recess 71 is removed, resulting in the structure shown in FIG. 3D. Finally, the remaining second sacrificial layer 20 is removed and the structure of FIG. 3E is obtained which is then processed further analogous to the method described above.

Another semiconducting device 100 which is manufactured with the method according to the invention is shown in FIG. 4. Between the source region 3 and the drain region 4 it comprises two first stacks 6A and 6B, each of which is substantially identical to the first stack 6 shown in FIG. 1, and between which the second stack 7 is arranged. Such a semiconducting device 100 has two control gate layers 9A and 9B which can be independently biased to induce tunneling of electric charges through the tunnel dielectric layers 11A and 11B into the charge storage layers 10A and 10B, respectively. It is therefore capable of storing two bits, one in each charge storage layer 10A and 10B.

The semiconducting device 100 shown in FIG. 4 can be manufactured using the method according to the invention. To this end, the surface 2 is provided with two provisional first stacks 6A' and 6B' which are arranged at the position of the first stacks 6A and 6B. Subsequently, any of the embodiments of the method described above may be applied.

In summary, in the method for manufacturing a semiconductor device 100, which comprises a semiconducting body 1 having a surface 2 with a source region 3 and a drain region 4 defining a channel direction 102 and a channel region 101, a first stack 6 of layers on top of the channel region 101, the first stack 6 comprising, in this order, a tunnel dielectric layer 11, a charge storage layer 10 for storing an electric charge and a control gate layer 9, and a second stack 7 of layers on top of the channel region 101 directly adjacent to the first stack 6 in the channel direction 102, the second stack 7 comprising an access gate layer 14 electrically insulated from the semiconducting body 1 and from the first stack 6, initially a first sacrificial layer 90 is used, which is later replaced by the control gate layer 9. A second sacrificial layer 20 is used to protect the body adjacent to the second sidewall 81 and opposite to the position 83 of the second stack 7 when providing the access gate layer 14.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements.

The invention claimed is:

1. A method for manufacturing a semiconductor device, the semiconductor device comprising:
    a semiconducting body having a surface with a source region and a drain region defining a channel direction and a single channel region between the source region and the drain region,
    a first stack of layers on top of the channel region, the first stack comprising in this order, a tunnel dielectric layer, a charge storage layer for storing an electric charge, and a control gate layer, and
    a second stack of layers on top of the channel region directly adjacent to the first stack in the channel direction, the second stack comprising an access gate layer, the method comprising the steps of:
    providing the channel region with a provisional first stack comprising, in this order, the tunnel dielectric layer, the charge storage layer and a first sacrificial layer,
    providing a second sacrificial layer covering at least a part of the surface adjacent to the first stack and opposite to a position of the second stack,
    removing the first sacrificial layer, and
    providing the control gate layer and the access gate layer.

2. A method for manufacturing a semiconductor device, the semiconductor device comprising:
    a semiconducting body having a surface with a source region and a drain region defining a channel direction and a single channel region between the source region and the drain region,
    a first stack of layers on top of the channel region, the first stack comprising in this order, a tunnel dielectric layer, a charge storage layer for storing an electric charge, and a control gate layer, and
    a second stack of layers on top of the channel region directly adjacent to the first stack in the channel direction, the second stack comprising an access gate layer, the method comprising the steps of:
    providing the channel region with a provisional first stack comprising, in this order, the tunnel dielectric layer, the charge storage layer and a first sacrificial layer,
    providing a second sacrificial layer covering at least a part of the surface adjacent to the first stack and opposite to a position of the second stack,
    removing the first sacrificial layer, and
    providing the control gate layer and the access gate layer, wherein the provisional first stack has a first sidewall in the channel direction facing a position of the second stack and has a second sidewall opposite to the first sidewall, wherein the second sacrificial layer also covers at least a part of the surface at the position of the second stack, and the method comprises, prior to the step of providing the control gate layer and the access gate layer, the further steps of:
    providing the first sidewall with a sidewall spacer, and
    removing the second sacrificial layer at least at the position of the second stack thereby creating a first recess, the first recess being separated by the sidewall spacer from the second recess created in the step of removing the first sacrificial layer, the part of the surface adjacent to the second sidewall remaining covered by the second sacrificial layer.

3. A method as claimed in claim 2, wherein the step of providing the control gate layer and the access gate layer comprises:
    providing a conductive layer to the first recess and the second recess, the conductive layer at least partly covering the second sacrificial layer, and
    removing at least a part of the conductive layer outside the first recess and the second recess thereby exposing the second sacrificial layer and electrically insulating the conductive layer in the first recess from the conductive layer in the second recess.

4. A method as claimed in claim 2, wherein the first recess defines the position of the second stack.

5. A method as claimed in claim 2, wherein:
the first stack comprises an inter-gate dielectric layer electrically insulating the charge storage layer from the control gate layer,
the second stack comprises an access gate dielectric layer electrically insulating the access gate layer from the semiconducting body; and the method further comprises the step of:
providing a dielectric layer to the first recess and the second recess, after the first recess and the second recess have been created, and before the conductive layer has been provided.

6. A method as claimed in claim 5, wherein the dielectric layer has a dielectric constant higher than that of silicon oxide.

7. A method as claimed in claim 3, wherein the conductive layer comprises a metal or a metal alloy.

8. A method as claimed in claim 1, wherein the charge storage layer comprises a floating gate layer.

9. A method as claimed in claim 1, wherein the charge storage layer comprises a charge-trapping layer.

10. A method as claimed in claim 1, wherein the first sacrificial layer comprises a silicon layer, the silicon layer being separated from the charge storage layer by a separation layer.

11. A method as claimed in claim 1, wherein the provisional first stack has sidewalls including a sidewall in the channel direction facing a position of the second stack, and the method comprises, prior to the step of providing the control gate layer and the access gate layer, the further step of forming the source and drain regions while said sidewall in the channel direction is situated.

12. A method as claimed in claim 1, wherein the provisional first stack has a sidewall in the channel direction facing a position of the second stack, and the method comprises, prior to the step of providing the control gate layer and the access gate layer, the further step of forming the source and drain regions with at least one of the sidewalls in place.

13. A method as claimed in claim 1, further including forming a spacer in a position over the surface between positions for the first and second stacks, and thereafter forming the source and drain regions.

14. A method as claimed in claim 1, further including forming a recess in the second sacrificial layer and forming in the recess a layer of the second stack.

15. A method as claimed in claim 1, further including forming a recess in the second sacrificial layer and forming in the recess at least one of the control gate layer and the access gate layer.

16. A method as claimed in claim 1, further including forming a recess in the second sacrificial layer and forming the access gate layer in the recess.

17. A method as claimed in claim 1, wherein the provisional first stack has a first sidewall in the channel direction facing a position of the second stack and has a second sidewall opposite to the first sidewall and wherein the second sacrificial layer also covers at least a part of the surface at the position of the second stack, and the method comprises, prior to the step of providing the control gate layer and the access gate layer, the further step of forming the source and drain regions with at least one of the sidewalls in place.

18. A method as claimed in claim 1, including, prior to the step of providing the control gate layer and the access gate layer, the further step of forming the source and drain regions.

19. A method as claimed in claim 1, wherein the charge storage layer comprises a floating gate layer, and including, prior to the step of providing the control gate layer and the access gate layer, the further step of forming the source and drain regions.

* * * * *